United States Patent
Fehlhaber

(10) Patent No.: US 6,314,481 B1
(45) Date of Patent: Nov. 6, 2001

(54) RESISTANCE INTEGRATED COUPLER BETWEEN DATABUS AND TERMINAL DEVICE HAVING DATABUS WINDINGS WITH HIGH RESISTANCE WIRE WITH RESISTANCE BEING 1.5 TIMES DATABUS CABLE NOMINAL CHARACTERISTIC IMPEDANCE

(75) Inventor: Gene L. Fehlhaber, Cave Creek, AZ (US)

(73) Assignee: Phoenix Logistics, Inc., Phoenix, AZ (US)

(*) Notice: Subject to any disclaimer, the term of this patent is extended or adjusted under 35 U.S.C. 154(b) by 0 days.

(21) Appl. No.: 09/233,696

(22) Filed: Jan. 19, 1999

(51) Int. Cl.[7] ............................. G06F 13/00; H01P 5/12; H03H 7/38; H04B 3/00; H03K 5/153
(52) U.S. Cl. .................... 710/100; 710/101; 333/100; 333/124; 333/131; 333/119; 375/257; 375/258; 327/86; 336/107; 439/189
(58) Field of Search ................................ 327/86; 307/231, 307/350, 355, 356, 358; 375/257, 258; 439/189; 336/107; 333/100, 119, 124, 131; 710/100, 101, 126, 129; 455/289

(56) References Cited

U.S. PATENT DOCUMENTS

| | | | | |
|---|---|---|---|---|
| 4,038,601 | * | 7/1977 | Laborie et al. | 375/219 |
| 4,149,030 | * | 4/1979 | Foreman | 178/59 |
| 4,388,716 | * | 6/1983 | Takezoe et al. | 370/294 |
| 4,479,228 | * | 10/1984 | Crane | 375/219 |
| 4,625,307 | * | 11/1986 | Tulpule et al. | 370/402 |
| 4,707,673 | * | 11/1987 | Lee et al. | 333/112 |
| 4,817,189 | * | 3/1989 | Pfizenmaier et al. | 455/6.1 |
| 4,825,450 | * | 4/1989 | Herzog | 375/288 |
| 5,073,762 | * | 12/1991 | Yu | 333/112 |
| 5,081,648 | * | 1/1992 | Herzog | 375/288 |
| 5,148,144 | * | 9/1992 | Sutterlin et al. | 340/310.01 |
| 5,546,419 | * | 8/1996 | Zierhut | 375/257 |
| 5,949,300 | * | 9/1999 | Olsson | 333/100 |
| 5,949,327 | * | 9/1999 | Brown | 340/310.01 |
| 6,212,224 | * | 4/2001 | Cammarota et al. | 375/219 |

* cited by examiner

Primary Examiner—Thomas Lee
Assistant Examiner—Ayruyruh Raul
(74) Attorney, Agent, or Firm—Weiss & Moy, P.C.; Harry M. Weiss; Jeffrey D. Moy

(57) ABSTRACT

A system and method for constructing a resistance integrated coupler adapted to be coupled between a data bus and a terminal device. The system and method includes the steps of calculating a desired resistance of a set of data-bus windings, wherein the desired resistance is substantially (1.5×Zo), wherein Zo is a selected data bus cable nominal characteristic impedance; winding the set of data-bus windings to form a first part of the resistance integrated coupler using a specified amount of high resistance wire, the specified amount of high resistance wire having a total resistance substantially equal to the calculated desired resistance; and winding a set of terminal device windings to form a second part of the resistance integrated coupler. The resistance integrated coupler is constructed substantially in accordance with the guidelines of MIL-STD-1553B.

7 Claims, 1 Drawing Sheet

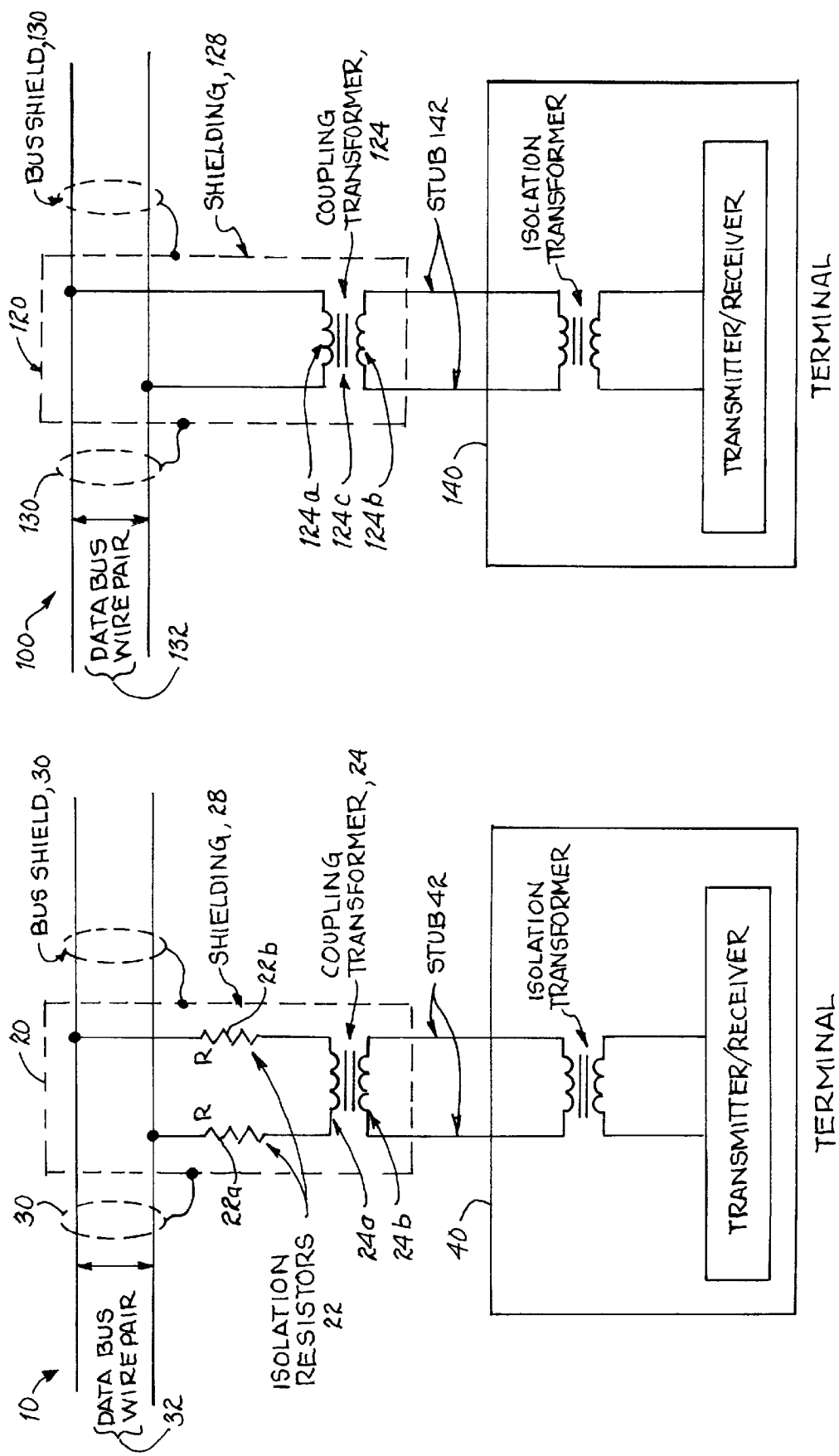

RESISTANCE INTEGRATED COUPLER BETWEEN DATABUS AND TERMINAL DEVICE HAVING DATABUS WINDINGS WITH HIGH RESISTANCE WIRE WITH RESISTANCE BEING 1.5 TIMES DATABUS CABLE NOMINAL CHARACTERISTIC IMPEDANCE

BACKGROUND OF THE INVENTION

1. Field of the Invention

This invention is in the field of data bus fault isolation couplers and methods therefor, and more particularly, is a coupler and method for a data bus fault isolation coupler featuring a coupling transformer with integrated resistance in a set of windings.

2. Description of the Related Art

Modern aircraft, ground and ocean platforms employ many on-board computer systems. These computer systems are concerned with command functions, platform control operations, and many other types of electronic system interfacing within or on the platform. In the military context, the installation and interconnection of the electronic systems with various computer systems is controlled by Military Specification requirements.

The Military Specifications for aircraft, spacecraft, ground vehicles and ocean vessels specify the linking of the various computer systems and electronic systems onboard with a Local Area Network type network built to military specifications. Typically, these interconnect systems onboard are called data bus networks. Within the United States military aircraft data bus networks are built to MIL-STD-1553B requirements, currently in revision B. Additionally, European military aircraft data bus networks are built to MIL-STD-1553B and STANAG 3838 requirements. The contents of MIL-STD-1553B and STANAG 3838 are incorporated herein by reference.

Both the United States and the European specifications specify that these data bus networks have electrical fault protection placed between the main data bus and each separate component, computer system, or terminal connected thereto. Specifically, each connection to the main data bus requires that a data bus coupler, constructed to the standards of MIL-STD-1553B and/or STANAG 3838 requirements be utilized between the main data bus and the component, computer system, or terminal connected to the main data bus. The MIL-STD-1553B and STANAG 3838 specifications require that directly coupled data bus couplers be built with internal fault isolation resistors to be placed in series with a step-up transformer to provide for protection to the main data bus in the event of a fault or short in a connected component or computer system. This interrelation of main data bus, data bus coupler, and component or computer system according to the prior art is shown in FIG. 1.

Presently, all data bus couplers are constructed using two wire non-inductive wound resistors connected in series with a coupling transformer. This configuration of components is usually packaged on a printed wring board (PWB), or potted into a Mil Spec MIL-T-21038 transformer module.

However, many drawbacks to this system and method of constructing data bus couplers exist. The addition of the two separate wire wound resisters increases the cost of the data bus coupler because not only the transformer must be purchased, but also the two wire wound resistors must be purchased, and all these components must meet the requirements of the applicable Military Specifications. Additionally, all the components must be electrically coupled together internal to the data bus coupler. This internal coupling of components effects the Mean Time Between Failures (MTBF). MTBF is an indicator of expected system reliability calculated on a statistical basis from the known failure rates of various components of the system, is usually expressed in hours, and may address both systems and individual population items. MTBF in a system is also directly proportional to the number of components and the number of electrical couplings, or joints, between each component. As the addition of the resistors adds two components and two joints, the MTBF will therefore be affected. Finally, the space required for the combination of the transformer and the two wire wound resistors is much greater than merely for a transformer alone.

Therefore a need existed for a system and method of removing the two separate wire wound resistors from a data bus coupler in order to reduce the cost, reduce the size of the coupler, and increase the MTBF of the coupler. Additionally, a need existed for a system and method of incorporating the required fault protection resistance into the transformer windings in order to meet the protection requirements of MIL-STD1553B.

SUMMARY OF THE INVENTION

An object of the present invention is to provide a system and method of constructing data bus couplers without the two separate wire wound resistors in the data bus coupler in order to reduce the cost, reduce the size of the coupler, and increase the MTBF of the coupler.

Another object of the present invention is to provide a system and method of constructing data bus couplers incorporating the required fault protection resistance into the transformer windings in order to meet the protection requirements of MIL-STD-1553B.

BRIEF DESCRIPTION OF THE PREFERRED EMBODIMENTS

In accordance with one embodiment of the present invention, a resistance integrated coupler adapted to be coupled between a data bus and a terminal device is disclosed. The resistance integrated coupler comprises; a set of terminal device windings, and a set of data-bus windings comprised of high resistance wire.

In accordance with another embodiment of the present invention, a method for constructing a resistance integrated coupler for coupling between a data bus and a terminal device is disclosed comprising the steps of: calculating a desired resistance of a set of data-bus windings, wherein the desired resistance is substantially (1.5×Zo), wherein Zo is a selected data bus cable nominal characteristic impedance; winding the set of data-bus windings to form a first part of the resistance integrated coupler using a specified amount of high resistance wire, in which the specified amount of high resistance wire has a total resistance substantially equal to the calculated desired resistance; and winding a set of terminal device windings to form a second part of the resistance integrated coupler; and wherein the resistance integrated coupler is constructed substantially in accordance with the guidelines of MIL-STD-1553B.

The foregoing and other objects, features, and advantages of the invention will be apparent from the following, more particular, description of the preferred embodiments of the invention, as illustrated in the accompanying drawings.

BRIEF DESCRIPTION OF THE DRAWING

FIG. 1. is a simplified schematic of the interrelation of prior art; data bus, data bus coupler, and component or computer system.

FIG. 2. is a simplified schematic of the interrelation of; data bus, data bus coupler, and component or computer system showing the integrated resistive winding of the data bus coupler of the present invention.

DESCRIPTION OF THE PREFERRED EMBODIMENTS

Introduction

MIL-STD-1553is a military standard that defines the electrical, mechanical and timing specifications for a dual-redundant communication network, that interconnects cooperating digital units in a system. This communication network, also referred to as a data bus, is typically used in avionics systems, but is also used in submarines, tanks and missiles. MIL-STD-1553B is a 1 Mbit/sec bus. It is a highly reliable bus, both because of its extremely low error rate (one word fault per 10 million words), and because of its dual-redundant architecture.

MIL-STD-1553B is a data bus that interconnects up to 31 terminals (referred to as Remote Terminals, or RTs), controlled by a single controller unit (referred to as the Bus Controller, or BC). All of the RTs, and the BC, are connected using two separate busses. These are named the Primary Bus (or bus 'A') and the Secondary Bus (bus 'B'). Messages are normally transferred only on the primary bus. If a message fails to be transferred over one bus, transfer may be retried on the other bus. An RT is usually a single box, that has some information to send out, and needs other information to be sent in. (A sensory unit, for example, would only need to send data out, while a fuel control unit would need to transfer data in and out.) An RT sends or receives data only when instructed to do so by the BC. The role of the bus controller is typically assigned to one of the more powerful units on the bus (e.g., the mission computer).

Referring to FIG. 1, a simplified schematic of the interrelation of prior art; data bus, data bus coupler, and component, computer system, or terminal is shown ("the prior art system 10" hereinafter). The main data bus 32 is terminated at each end with the cable characteristic impedance in order to minimize reflections caused by transmission line mismatch. With no connections or couplings to the main data bus 32, the main data bus 32 looks like an infinite length transmission line and therefore there are no disturbing reflections. When the data bus couplers 20 are added for connection of the RTs 40, the main data bus 32 is loaded locally and a mismatch occurs with resulting reflections. The degree of mismatch and signal distortions caused by reflections are a function of the impedance (Z) presented by the data bus coupler 20 and RT 40 input impedance. In order to minimize signal distortion, it is desirable that the data bus coupler 20 maintain a high impedance. This impedance is reflected back to the main data bus 32. At the same time the impedance needs to be kept low so that adequate signal power will be delivered to the RT 40 input. Therefore, a trade-off and compromise between these conflicting requirements is necessary to achieve the specified signal-to-noise ratio and system error rate performance. MIL-STD-1553B specifies transformer coupling with stubs, and requires a data bus coupler 20 box, separate from the RT 40, located near the junction of the main data bus 32 and stub 42. The coupling transformer 24 used within the data bus coupler 20 is specified by MIL-STD-1553B §4.5.1.5.1.1, which states that a coupling transformer 24 shall be required, and shall have a turns ratio of 1:1.41 ±3.0 percent, with the higher turns on the main data bus 32 side of the stub 42. The coupling transformer 24 characteristics defined in MIL-STD-1553B provide a compromise between the signal level and distortion characteristics delivered to the RTs 40. The coupling transformer 24 turns ratio (1:1.41) provides impedance transformation for both RT 40 reception and transmission. The improvement of stub 42 load impedance is a result of impedance transformation, which is proportional to the square of the turns ratio, assuming an ideal coupling transformer 24.

In addition to the coupling transformer 24, MIL-STD-1553B §4.5.1.5.1.2 specifies that an isolation resistor 22a & b shall be placed in series with each connection to the main data bus 32 cable to provide protection for the main data bus 32 in case of a short circuit in the stub 42 or RT 40. Each resistor 22a & b shall have a value of (0.75×Zo) plus or minus 2.0 percent, where Zo is the selected cable nominal characteristic impedance. The impedance placed across the main data bus 32 cable shall be no less than (1.5×Zo) ohms for any failure of the coupling transformer 24, cable stub 42, or RT 40 transmitter/receiver.

An additional requirement within MIL-STD-1553B §4.5.1.5.1.3, is that all coupling transformers 24 and isolation resistors 22, as specified in §4.5.1.5.1.1 and §4.5.1.4.1.2, shall have continuous shielding 28 which will provide a minimum of 75 percent coverage of the data bus coupler 20 and that the shielding 28 shall couple to the bus shield 30. The isolation resistors 22 and coupling transformer 24 shall be placed at the minimum possible distance from the junction of the stub 42 to the main data bus 32.

Integrated Fault Isolation Data Bus Coupler

Referring to FIG. 2, the Integrated Fault Isolation ("IFI" hereinafter) data bus coupler, data bus, and component or computer system relationship of the present invention is shown, (the "IFI system 100" hereinafter.) The IFI data bus coupler 120 replaces the two resistors 24a & b (see FIG. 1) that are series wired with the primary winding 24 (see FIG. 1) of the coupling transformer 24 (see FIG. 1) with an integrated fault isolation package comprised of a single primary winding 124a.

The IFI package replaces the primary winding 24a (see FIG. 1) with a special gage of high resistance wire that has been drawn to meet specific length and resistance properties. This length of high resistance wire is equal to the sum of the resistance of the two isolation resistors 22a & b (see FIG. 1) added to the resistance of the primary winding 24a (see FIG. 1). The length of high resistance wire is wound directly onto the inductor core 124c of the coupling transformer 124 and thus constitutes the new primary winding 124a. The inductive properties of the inductor core 124c have been balanced to provide the required transformation ratio specified in MIL-STD-1553B. Thus, the required fault isolation resistance is integrated directly within the inductor core 124c of the coupling transformer 124. This integration of the resistance, and therefore the removal of the two resistors 22a & b (see FIG. 1) also results in a perfect balance between the two sides of the data bus coupler 120, and also reduces reflections due to the absence of the two additional joints required by the resistors 22a & b (see FIG. 1).

The functional advantage of the IFI data bus coupler 120 is that one component now performs the functions of three components. Less components mean fewer interconnects and thus this offers a more reliable main data bus 132 network. The IFI data bus coupler 120 design eliminates the two resistors 22a & b (see FIG. 1) and the two additional solder joints, which contributed to a 650%, increase in the MTBF of each IFI data bus coupler 120. Additionally, elimination of the resistors 24 (see FIG. 1) offers a smaller overall module volume—this translates to a smaller and lighter package. The IFI data bus coupler 120 module whose schematic is shown in FIG. 2 is 2 grams lighter than a T-21038 potted data bus module design, having the resistors 22*a* & *b* of FIG. 1, currently marketed by Phoenix Logistics of Phoenix, Arizona. Lower manufacturing costs are realized by eliminating the two Mil Spec MIL-R-39007 wire-wound resistors 22*a* & *b* (see FIG. 1.). The new high resistance wire winding simply replaces the original inductor primary winding 24*a* (see FIG. 1) wire, without significantly affecting manufacturing cost of the coupling transformer 124.

All other details regarding the coupling of the stubs 142, the coupling of the shielding 128 to the bus shield 130, and the coupling of the primary winding 24*a* wire to the main data bus 132 are essentially the same as the prior art system 10, or as is according to methods and techniques well known in the art.

Although the invention has been particularly shown and described with reference to a preferred embodiment thereof, it will be understood by those skilled in the art that changes in form and detail may be made therein without departing from the spirit and scope of the invention.

What is claimed is:

1. A resistance integrated coupler adapted to be coupled between a data bus and a terminal device, comprising, in combination:

a set of terminal device windings; and a set of data-bus windings comprised of high resistance wire, said high resistance wire having a resistance value of substantially (1.5×Zo), wherein Zo is a selected data bus cable nominal characteristic impedance.

2. The coupler of claim 1 wherein said resistance integrated coupler is physically shielded against EMF to at least 75%, said shielding further comprising means for substantially hermetically sealing said resistance integrated coupler from a surrounding environment.

3. The coupler of claim 2 wherein said resistance integrated coupler is substantially constructed in accordance with the guidelines of MIL-STD-1553B.

4. The coupler of claim 1 wherein said resistance integrated coupler is physically shielded against EMF to at least 75%.

5. The coupler of claim 1 further comprising means for substantially hermetically sealing said resistance integrated coupler from a surrounding environment.

6. The coupler of claim 1 wherein said resistance coupler is substantially constructed in accordance with the guidelines of MIL-STD-1553B.

7. A method for constructing a resistance integrated coupler for coupling between a data bus and a terminal device, comprising, the steps of:

calculating a desired resistance of a set of data-bus windings, wherein said desired resistance is substantially (1.5×Zo), wherein Zo is a selected data bus cable nominal characteristic impedance;

winding said set of data-bus windings to form a first part of said resistance integrated coupler using a specified amount of high resistance wire, said specified amount of high resistance wire having a total resistance substantially equal to said calculated desired resistance; and winding a set of terminal device windings to form a second part of said resistance integrated coupler;

wherein said resistance integrated coupler is constructed substantially in accordance with the guidelines of MIL-STD-1553B.

* * * * *

UNITED STATES PATENT AND TRADEMARK OFFICE
Certificate

Patent No. 6,314,481 B1                                                                 Patented: November 6, 2001

On petition requesting issuance of a certificate for correction of inventorship pursuant to 35 U.S.C. 256, it has been found that the above identified patent, through error and without any deceptive intent, improperly sets forth the inventorship.
Accordingly, it is hereby certified that the correct inventorship of this patent is: Richard P. Hewitt, Romaland, CA.

Signed and Sealed this Twenty-third Day of August 2005.

JEFFREY A. GAFFIN
*Supervisory Patent Examiner*
Art Unit 2182